United States Patent [19]

Schuster et al.

[11] Patent Number: 5,437,725
[45] Date of Patent: Aug. 1, 1995

[54] DEVICE FOR THE CONTINUOUS COATING OF A METALLIC MATERIAL IN MOTION WITH A POLYMER DEPOSITION HAVING A COMPOSITION GRADIENT

[75] Inventors: Frédéric Schuster, Saint Germain En Laye; Gérard Piet, Bezons, both of France

[73] Assignee: SOLLAC, Societe anonyme, Puteaux, France

[21] Appl. No.: 214,548

[22] Filed: Mar. 18, 1994

[30] Foreign Application Priority Data

Mar. 26, 1993 [FR] France ................. 93 03709

[51] Int. Cl.⁶ .................. C23C 16/50; C23C 16/54
[52] U.S. Cl. .................. 118/718; 118/723 E; 118/730
[58] Field of Search ............ 118/718, 719, 723 E, 118/723 MW, 723 ME, 723 MR, 723 MA, 723 AN, 730

[56] References Cited

U.S. PATENT DOCUMENTS

| | | | |
|---|---|---|---|
| 4,440,107 | 4/1984 | Dechler et al. | 118/718 |
| 4,863,756 | 9/1989 | Hartig et al. | 118/718 X |
| 5,224,441 | 7/1993 | Felts et al. | 118/718 |

FOREIGN PATENT DOCUMENTS 0299754 1/1989 European Pat. Off.
60-063724 4/1985 Japan.
2281420 11/1990 Japan.

*Primary Examiner*—Nam Nguyen
*Assistant Examiner*—Jonathan D. Baskin
*Attorney, Agent, or Firm*—Sixbey, Friedman, Leedom & Ferguson

[57] ABSTRACT

The subject of the invention is a process of continuous coating, with a polymer deposition, of a metallic material in motion inside a chamber under a reduced pressure, in which process the monomer of the said polymer is injected, in the gaseous state, into the said chamber and the conditions for forming a cold plasma are created so as to cause coating of the said material with the said polymer deposition, which comprises, in at least one region of the said chamber, the said material being made to pass through a magnetic field so as to cause a variation in the composition of the said polymer deposition in the said region. The subject of the invention is also a device for the implementation of this process, and a product obtained thereby.

3 Claims, 1 Drawing Sheet

DEVICE FOR THE CONTINUOUS COATING OF A METALLIC MATERIAL IN MOTION WITH A POLYMER DEPOSITION HAVING A COMPOSITION GRADIENT

FIELD OF THE INVENTION

The present invention relates to the coating of metallic materials with organic polymers, such as polysilanes or polysiloxanes, especially for the purpose of protecting these products from corrosion.

PRIOR ART

The coating of metallurgical products with polymers by means of processes using a cold plasma created in an atmosphere under reduced pressure containing their monomers is currently well known. The depositions obtained may possess the functions of protecting the metallic substrate from corrosion, or of promoting the adhesion, on the said product, of a paint layer or of another polymer deposited by another technique. To this end, polymers formed from oxygen-containing monomers, such as silanes or siloxanes, can be used. These polymers are particularly advantageous in that the monomer molecules in the plasma are dissociated to a greater or lesser extent depending on the temperature and pressure conditions in the chamber under reduced pressure in which the treatment takes place, and also depending on the electrical parameters governing the formation of the plasma. In the case of a strong dissociation, the polymer which is deposited on the substrate possesses a pronounced "inorganic" character, that is to say the Si—O bonds are particularly numerous. Conversely, in the case of a weak dissociation, the polymer possesses a very predominant "organic" character, with Si—O bonds hardly more extensive than in the monomer.

It may be desired to deposit several superimposed polymer layers on the product to be coated, each of these layers being of a different nature. This is fairly easy when the product is a single component held fixed during the coating steps: all that remains to be done, when the deposition of one layer is deemed to be complete, is to vary the treatment parameters (composition of the atmosphere, electrical parameters, etc.) in an appropriate manner in order to produce the deposition of the next layer. In particular, it is known to produce successively a polysilane or polysiloxane deposition and then a silica deposition by introducing into the treatment chamber firstly a pure silane or siloxane monomer, in order to form the polymer layer, and then by mixing the said monomer with oxygen in order to form the silica layer. On the other hand, when the product is a strip in motion which has to be continuously coated, this is possible, according to the known processes (see, for example, French Patent Application FR 91 13720), only by passing the product successively through several chambers. Conditions suitable for the deposition onto the product of a layer of specified nature are established inside each of these chambers, and these chambers have to be separated from each other in a sealed manner. This involves constructing relatively complicated installations. In addition, the latter do not make it possible to produce a gradual change in the composition of the deposition, since the boundary between the various layers is always defined in a clear-cut manner. However, such a gradual change may be desired so as to obtain maximum adhesion of a given layer to the previously deposited layer. This problem arises, for example, when it is desired to deposit several layers of the same base polymer, the said layers possessing an alternating organic and inorganic character.

SUMMARY OF THE INVENTION

The object of the invention is to propose a means for carrying out, inside the same chamber, the deposition of several successive layers, of dominant inorganic or organic character, of the same polymer onto a metallic product in motion.

To this end, the invention is a process of continuous coating, with a polymer deposition, of a metallic material in motion inside a chamber under a reduced pressure, in which process the monomer of the said polymer is injected, in the gaseous state, into the said chamber and the conditions for forming a cold plasma are created so as to cause coating of the said material with the said polymer deposition, which comprises, in at least one region of the said chamber, the said material being made to pass through a magnetic field so as to cause a variation in the composition of the said polymer deposition in the said region.

The subject of the invention is also a device for the continuous coating, with a polymer deposition, of a metallic material in motion, of the type having a sealed chamber fitted with means for obtaining therein and maintaining therein a reduced pressure, means for progressively moving the said material inside the said chamber, means for introducing the monomer of the said polymer, in the gaseous state, into the said chamber, means for creating the conditions for forming, inside the said chamber, a cold plasma over the path of the said material in motion, which also comprises means for superimposing a magnetic field on the said cold plasma over a fraction of the said path of the said material in motion.

Finally, the subject of the invention is a product obtained by the process according to the invention.

As will have been understood, the invention consists in making the product, while it is progressing through the treatment chamber containing the monomer of the polymer to be deposited, pass through several successive zones in each of which it is exposed to a cold plasma leading to a polymer deposition onto its surface. In one of these zones at least, the influence of a magnetic field is superimposed on that of this plasma. This magnetic field substantially modifies the conditions under which the monomer molecules react, to the point of changing the chemical nature of the deposition which, in the zone in question, is formed on the product. Compared to the usual processes for forming, on the metallic substrate, several layers of different natures from the same monomer, this invention does not require the atmosphere in the chamber to be modified, and the various depositions may thus be continuously carried out in the same chamber.

DESCRIPTION OF THE PREFERRED EMBODIMENT(S)

Figure 1:
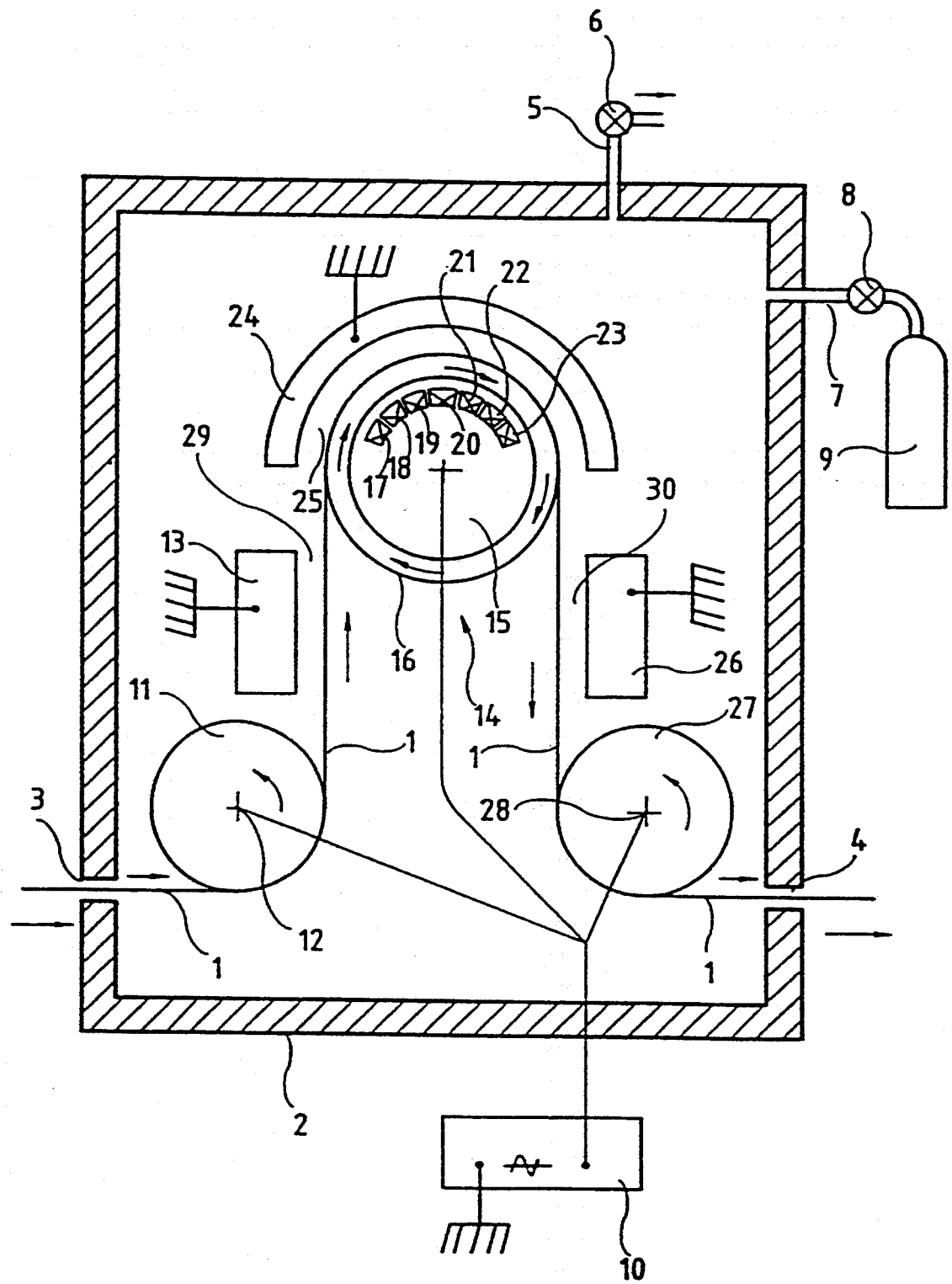
FIG. 1 is a schematic representation of the device of the invention.

The invention will be better understood upon reading the description which follows, referring to the single figure which shows, diagrammatically, an example of a device according to the invention.

In this single figure, the product to be coated is in the form of a strip 1 made of metal such as bare steel or galvanized steel, set into progressive movement by conventional means (not shown). Here, it is desired to coat it on one of its faces with an organic polymer, the monomer of which contains silicon and oxygen atoms. This polymer is capable of exhibiting a fairly pronounced inorganic character, that is to say of possessing a greater or less proportion of Si—O bonds compared to Si—Si, Si—C and Si—H bonds. A polysilane or a polysiloxane complies with these criteria. To this end, the strip 1 is made to penetrate into a sealed chamber 2. The strip 1 penetrates into the chamber 2 through an inlet orifice 3 and the strip 1 leaves the chamber 2 through an outlet orifice 4. These two orifices 3 and 4 are fitted with sealing means, not shown, so as to isolate the chamber 2 from the outside even when the strip 1 is engaged therein. Attached to the chamber 2 is also a pipe 5, connecting it to the outside via a pump 6. This pump 6 makes it possible to maintain a specified reduced pressure, of the order of 0.1 to 1,000 Pa, or even less if necessary, in the chamber 2. Finally, another pipe 7 is connected via a valve 8 to a bottle 9 containing the monomer of the polymer to be deposited, this monomer being under temperature and pressure conditions such that it can escape from the bottle 9 in order to penetrate into the chamber 2 in the vapor state. The installation also includes an AC generator 10, one of the poles of which is connected to earth and it will be seen later which members the other pole of which generator is connected up to.

After its penetration into the chamber 2, the strip 1 comes into contact with a first roller 11, which is free to rotate or is driven about its axis 12. The role of this first roller 11 is twofold. Firstly it guides the strip 1 and it contributes to maintaining it in a suitable state of tension and planarity. On the other hand, it is connected to one of the poles of the generator 10 and imparts its potential to the strip 1. After having left the first roller 11, the strip 1 passes in front of a first electrode 13 connected to earth, defining with the strip 1 a space 29. Next, the band 1 comes into contact with a second roller 14. This second roller, made of non-magnetic material, is constructed in two parts: a stationary core 15 and an outer shell 16 which, by virtue of appropriate means, not shown, such as bearings, can rotate on the surface of the stationary core 15 when this shell is driven by the strip 1 with which it is in contact. This second roller 14 is connected to the same pole of the generator 10 as the first roller 11, and also contributes to the imposition of the potential of the generator 10 to the strip 1. Integrated into the stationary core 15 are permanent magnets 17, 18, 19, 20, 21, 22, 23 distributed over the circumference of the stationary core 15 in the vicinity of its surface, opposite the zone of the circumference of the shell 16 which is in contact with the strip 1. Facing a part of this zone at least, and opposite the permanent magnets 17 to 23, is arranged a second electrode 24 which is connected to earth and which defines, with the strip 1, a space 25 of substantially constant width (although this is not strictly speaking absolutely necessary). After having left the second roller 14, the strip 1 moves progressively in front of a third electrode 26 identical to the first electrode 13, and it also is connected to earth. The strip 1 and the third electrode 26 define a space 30. Next, it passes over a third roller 27, which is free to rotate or is driven about its axis 28, and is connected to the same pole of the generator 10 as the other two rollers 11, 14. Its role is comparable to that of the first roller 11. Next, the strip 1 leaves the chamber 2 through the orifice 4.

The installation is used as follows. Firstly, the beginning of the strip 1 is introduced into the chamber 2. Next, the chamber is put under reduced pressure and the monomer of the polymer to be deposited, for example hexamethyldisiloxane (HMDS), is introduced therein so as to maintain a partial pressure of HMDS of the order of 10 to 100 Pa, for example. Next, the progressive movement of the strip 1 is initiated and the generator 10 set to operate at a frequency of the order of 50 kHz with a power of a few tens of watts. In this way, the strip 1 is biased, the strip behaving as cathode while the three electrodes 13, 24, 26 behave as anodes. The effect of the potential difference existing between the strip 1 and the electrodes 13, 24, 26 is to create a low-temperature plasma within the spaces 25, 29, 30 which separate them. The effect of this plasma is to dissociate the HMDS molecules and these are deposited in the form of a polymer of the polysiloxane type onto the face of the strip 1 which progressively moves in front of the electrodes.

As has been stated, this polysiloxane may exhibit a fairly pronounced inorganic character. However, the presence in the stationary core of the second roller 14 of the permanent magnets 17 to 23 very substantially modifies the operating conditions in the space 25, compared to those existing in the spaces 29 and 30. In fact, conditions of the "magnetron sputtering" type are obtained therein which are known to cause very extensive dissociation of the monomer molecules and particularly high rates of deposition of the polymer. Moreover, these conditions go hand in hand with an accentuated inorganic character for the said polymer deposition. It is therefore possible, by using the installation which has just been described, to carry out in succession the deposition of three alternating polymer layers onto the strip 1:

a first layer, predominantly organic, deposited facing the first electrode 13;

a second layer, having a more pronounced inorganic character, deposited facing the second electrode 24, while the magnetic field created by the permanent magnets 17 to 23 is superimposed on the electric field existing between the strip 1 and the electrode 24;

a third layer, predominantly organic, deposited facing the third electrode 26.

By way of example, the following operating conditions may be used:

generator 10 having a power of 80 W and a frequency of 50 kHz;

HMDS pressure in the chamber 1: 0.3 mbar;

magnetic field between the second electrode 24 and the second roller 14: intensity of the order of 1000 G.

Under these conditions, when facing the two electrodes 13 and 26 which are not affected by a magnetic field, a rate of growth of the polymer layer of approximately 0.3 $\mu$m/min is observed. On the other hand, when facing the second electrode 24, under the influence of the magnetic field, a rate of growth of the polymer layer of approximately 2.4 $\mu$m/min is observed. Moreover, as has been stated, this layer exhibits a stronger inorganic character than the other two.

It is possible to produce polymer layers of greater or lesser respective thicknesses as a function of the time which the strip 1 spends in the various parts of the installation (and therefore as a function of the speed of progressive movement of the strip 1 and of the length of the electrodes 13, 24, 26). The particularly high rates of deposition observed, especially for the zone subjected to the magnetic field, render this process compatible with an industrial operation in which the strip 1 would move progressively at a speed of 25 to 50 m/min in a reactor which would only be 2 to 4 m in length. It would thus be possible to obtain depositions of 2000 to 2500 Å in thickness, knowing that they constitute good corrosion barriers on steel products coated with zinc-/nickel alloy and other galvanized products.

In the example described, a first, predominantly organic, polysiloxane layer, a second, predominantly inorganic, polysiloxane layer and a third, predominantly organic polysiloxane layer would therefore be obtained. The advantage of such a multilayer product compared to a product which would exhibit only a single polysiloxane layer having an inorganic or organic character, is that such a multilayer deposition constitutes a better corrosion barrier than a monolayer deposition of equivalent thickness. Moreover, it is thus possible to benefit simultaneously from the advantageous properties of the two types of coating: for example, from the better mechanical strength of the depositions having a strong inorganic character compared to the predominantly organic depositions, and from the more hydrophobic character of the latter which render them more capable of receiving a paint layer.

Of course, it is possible to imagine numerous variants of the installation which has just been described. For example, it is possible to use only a single, large-sized permanent magnet, or any other device for imposing a magnetic field. It is also possible to impose progressive variations in the magnetic field within the space 25, which field, for example, would increase from the magnet 17 to the magnet 20, and then decrease once again down to the magnet 23. Thus, a progressive variation in the organic/inorganic character of the polymer deposition would be obtained which would guarantee excellent cohesion of the deposition. Likewise, it is possible to provide only a single zone with deposition not enhanced by a magnetic field, and therefore a deposition of only two differentiated polymer layers; or, conversely, to increase the number of electrodes in order to be able to increase accordingly the number of layers, or even to coat both faces of the strip by making these move progressively, in succession, in front of as many electrodes as necessary. Finally, instead of employing a conventional AC generator, it is possible to employ a radiofrequency generator operating at 13.56 MHz, as is commonly used in the field of plasma treatments. It would also be possible to employ a DC generator. However, in the latter case, there would be a constraint which limits the deposited thickness of the polymer to only a few thousands of Å, since beyond this the insulating character of the deposition would lead to breakdown phenomena which would damage the coating. On the other hand, it is possible to provide separate electrical power supplies for each electrode.

Likewise, any device other than the roller 14 which has just been described may be used if it provides functions comparable to those of the roller, namely the formation of a cold plasma superimposed with a magnetic field over a fraction of the travel of the strip 1 in the chamber 2.

Finally, the applications of the invention are not limited to the deposition of polysilanes or polysiloxanes, but to the deposition of any polymer whose composition is influenced by the superimposition of a magnetic field on the cold plasma which causes the polymerization.

We claim:

1. A device for the continuous coating, with a polymer deposition, of a metallic material in motion, of the type having a sealed chamber fitted with means for obtaining therein and maintaining therein a reduced pressure, means for progressively moving the material inside the chamber along a path; means for introducing a monomer of the polymer, in the gaseous state, into the chamber, means for creating conditions for forming, inside the chamber, a cold plasma over the path of the material in motion such that a polymer coating of a first composition is deposited on said metallic material, which also comprises means for superimposing a magnetic field on the cold plasma over a fraction of the path of the material in motion for changing the polymer coating deposited on the metallic material to a second composition while said material moves through said fraction of the path.

2. The device as claimed in claim 1, wherein the means for superimposing a magnetic field on the cold plasma over a fraction of the path of the material in motion are included in a non-magnetic roller comprising a stationary core in which the means are placed, and a shell being able to rotate on the surface of the stationary core, the external surface of the shell being designed to support the material in motion.

3. The device as claimed in claim 1, wherein the means for superimposing a magnetic field on the cold plasma is constituted by at least one permanent magnet.

* * * * *